US009110107B2

(12) United States Patent
Busca et al.

(10) Patent No.: US 9,110,107 B2
(45) Date of Patent: Aug. 18, 2015

(54) BATTERY TEST CIRCUIT WITH ENERGY RECOVERY

(71) Applicant: Tyco Safety Products Canada Ltd., Concord (CA)

(72) Inventors: Andrei Busca, Toronto (CA); Stephen D. W. Fosty, Brampton (CA)

(73) Assignee: TYCO SAFETY PRODUCTS CANADA LTD., Concord (CA)

( * ) Notice: Subject to any disclaimer, the term of this patent is extended or adjusted under 35 U.S.C. 154(b) by 317 days.

(21) Appl. No.: 13/625,999

(22) Filed: Sep. 25, 2012

(65) Prior Publication Data
US 2013/0154654 A1 Jun. 20, 2013

Related U.S. Application Data

(60) Provisional application No. 61/577,303, filed on Dec. 19, 2011.

(51) Int. Cl.
| | |
|---|---|
| *H02J 7/00* | (2006.01) |
| *H02J 7/04* | (2006.01) |
| *H02J 1/12* | (2006.01) |
| *H02J 1/00* | (2006.01) |
| *G01N 27/416* | (2006.01) |
| *G05F 1/00* | (2006.01) |
| *G01R 23/02* | (2006.01) |
| *G01R 19/00* | (2006.01) |
| *G06F 17/00* | (2006.01) |
| *H02H 3/087* | (2006.01) |
| *H02H 3/06* | (2006.01) |

(52) U.S. Cl.
CPC ............... *G01R 23/02* (2013.01); *G01R 19/00* (2013.01); *G06F 17/00* (2013.01); *H02H 3/087* (2013.01); *H02J 7/0068* (2013.01); *H02H 3/06* (2013.01)

(58) Field of Classification Search
CPC ........ H02H 3/087; G06F 17/00; G01R 23/02; G01R 19/00; G01R 31/36; H02J 7/0068
USPC .......... 320/137, 140; 323/282; 307/45, 46, 80, 307/82, 85, 86
See application file for complete search history.

(56) References Cited

U.S. PATENT DOCUMENTS

| | | | | | |
|---|---|---|---|---|---|
| 5,545,935 | A | * | 8/1996 | Stewart | 307/150 |
| 5,917,417 | A | * | 6/1999 | Girling et al. | 340/628 |
| 6,137,280 | A | * | 10/2000 | Ackermann et al. | 323/354 |
| 6,249,124 | B1 | * | 6/2001 | Bertness | 324/426 |
| 6,320,358 | B2 | * | 11/2001 | Miller | 323/222 |
| 6,331,365 | B1 | * | 12/2001 | King | 429/9 |
| 6,526,361 | B1 | * | 2/2003 | Jones et al. | 702/63 |
| 7,129,706 | B2 | * | 10/2006 | Kalley | 324/426 |
| 7,545,146 | B2 | * | 6/2009 | Klang et al. | 324/426 |
| 7,692,400 | B2 | * | 4/2010 | Kanouda et al. | 320/101 |
| 7,999,505 | B2 | * | 8/2011 | Bertness | 320/104 |
| 2006/0055367 | A1 | * | 3/2006 | Iwata et al. | 320/103 |
| 2009/0107743 | A1 | * | 4/2009 | Alston et al. | 180/65.21 |
| 2010/0283773 | A1 | * | 11/2010 | Kim | 345/211 |
| 2011/0084648 | A1 | * | 4/2011 | Cao et al. | 320/103 |
| 2012/0126627 | A1 | * | 5/2012 | Tonicello et al. | 307/82 |

* cited by examiner

*Primary Examiner* — M'Baye Diao

(57) ABSTRACT

A battery test circuit for testing batteries in a working circuit having a plurality of batteries includes a DC step up converter. The DC step up converter may be selectively interconnected between a first one of a plurality of batteries and a second one of a plurality of batteries, to draw a test current from the first battery and to supply current at an elevated voltage to the second battery. The test circuit further includes an indicator output for providing a signal indicative of whether the first battery provides the test current substantially at its rated voltage.

15 Claims, 3 Drawing Sheets

BATTERY TEST CIRCUIT WITH ENERGY RECOVERY

CROSS-REFERENCE TO RELATED APPLICATIONS

The present application claims priority from U.S. Provisional Patent Application No. 61/577,303, filed Dec. 19, 2011, the contents of which are hereby incorporated by reference.

FIELD OF THE INVENTION

The present application relates to battery test circuits, and more particularly to battery test circuits with energy recovery.

BACKGROUND OF THE INVENTION

In systems which rely on batteries, such as power backup systems, electric vehicles and the like, it is often necessary to test the condition of the batteries therein.

A typical procedure for testing batteries is to connect a load to a battery such that a desired test current is drawn from the battery and measure parameters of the battery output, such as voltage. A voltage below a certain expected value indicates deterioration of the battery being tested.

Unfortunately, during this type of testing, energy is drawn from the battery being tested. This energy is typically passed through and dissipated by the test load, for example, as heat. Further, the battery under test may need to be removed from the circuit it drives, interrupting operation of the circuit.

Accordingly, there is a need for improved battery testing systems and methods.

SUMMARY OF THE INVENTION

In an embodiment, a battery test circuit for testing batteries in a working circuit having a plurality of batteries includes a DC step up converter. The DC step up converter may be selectively interconnected between a first one of a plurality of batteries and a second one of a plurality of batteries, to draw a test current from the first battery and to supply current at an elevated voltage to the second battery. The test circuit further includes an indicator output for providing a signal indicative of whether the first battery provides the test current substantially at its rated voltage.

According to an aspect of the present invention, there is provided a battery test circuit, for testing batteries in a working circuit having a plurality of batteries and a load, the test circuit comprising: a DC step up converter having an input at a first voltage and an output at a second voltage higher than the first voltage, that may be selectively interconnected between a first one of the plurality of batteries and at least one second one of the plurality of batteries to cause the first battery to supply a defined test current and deliver a current from the output to the at least one second one of the plurality of batteries; and an indicator output, for providing a signal indicative of whether the first battery provides the test current, substantially at the rated voltage of the first battery.

According to another aspect of the present invention, there is provided a method of testing a battery in a working circuit comprising a plurality of batteries, the method comprising: interconnecting a first battery of the plurality of batteries with an input of a DC step up converter to draw a test current at an input voltage from the first battery; interconnecting a second battery of the plurality of batteries with an output of the DC step up converter to supply current at an elevated voltage higher than the input voltage to the second battery and any load interconnected to the second battery; monitoring a voltage of the first battery to determine if the first battery is able to provide the test current.

BRIEF DESCRIPTION OF THE DRAWINGS

In the figures, which illustrate by way of example only, embodiments of this invention.

DETAILED DESCRIPTION

Figure 1:
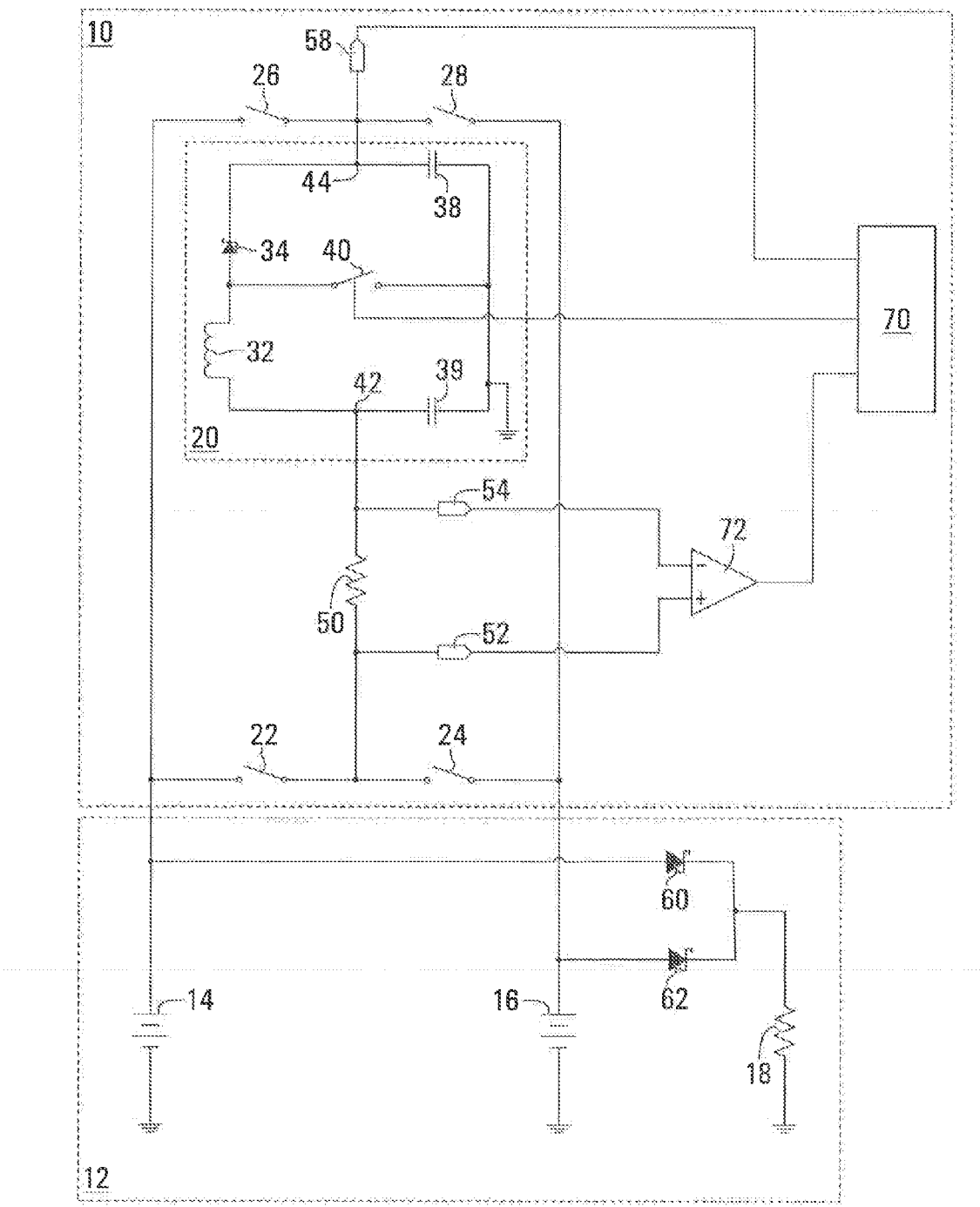
FIG. 1 is a schematic view of a circuit exemplary of the present invention.

FIG. 1 depicts a battery testing circuit 10, exemplary of an embodiment of the present invention. Testing circuit 10 is connected to a working circuit 12, which includes batteries 14, 16 and output load 18. Load 18, shown as a single resistor, is representative of any output load, including loads comprising multiple components that may be resistive, reactive or even active.

Working circuit 12 may be, for example a battery backup for an alarm system, a circuit in an electric vehicle, or any other electrical circuit which uses two or more batteries. Typically, the specifications of batteries 14, 16 of working circuit 12 are identical: they are of the same type and have the same maximum capacity, and nominal voltage ratings.

Batteries 14, 16 are depicted as connected in parallel. In typical use, load 18 draws a working current from batteries 14 and 16. However, batteries 14, 16 and/or working circuit 12 may be rated to a maximum current which is much higher than the typical working current.

Periodically, batteries 14, 16 may need to be tested. Such testing may involve connecting a load to the battery under test such that a test current larger than the working current typically drawn from the battery during use is drawn from the battery under test. The voltage at which the test current is supplied is determined. Voltage below a certain expected level, generally, the nominal voltage rating of the battery, is indicative of battery deterioration, possibly as a result of increased internal resistance.

Test circuit 10 includes a DC step up converter 20, a plurality of input switches 22 and 24 and a plurality of output switches 26, 28. Each of the input switches connects a corresponding one of batteries 14, 16 to the input 42 of DC step up converter 20. Each of the output switches connects a corresponding one of batteries 14, 16 to the output of DC step up converter 20. Specifically, the input of DC step up converter 20 is connected to battery 14 by way of switch 22 and to battery 16 by way of switch 24. The output 44 of DC step up converter 20 is connected to battery 14 and output load 18 by way of switch 26 and to battery 16 and output load 18 by way of switch 28. Thus, by closing of switches 22, 28 or 24, 26 DC step up converter may selectively be interconnected between batteries 14, 16. Alternatively, if all of switches 22, 24, 26, 28 are open, DC step up converter 20 is not connected between batteries 14, 16.

DC step up converter 20 is a DC to DC power converter, capable of delivering a DC output voltage greater than its DC input voltage. Example DC step-up converter 20 includes inductor 32, diode 34, capacitors 38 and 39 and switch 40. During operation of DC step up converter 20, switch 40 cycles between an open position (off state) and a closed position (on state). When switch 40 is in the on state, inductor 32 is isolated from capacitor 38 by diode 34. At this point, inductor 32 is building up a magnetic field due to the current flow through inductor 32 and switch 40 to ground. When switch 40 is in the off state, current flows via inductor 32 to capacitor 38 and output node 44, due to collapsing of the magnetic field in inductor 32. Capacitor 39 isolates input node 42 of DC step up converter 20 from ground.

Switch 40 is cycled periodically, where one cycle is the time between successive closings of switch 40. Switch 40 remains closed for a certain portion of each cycle. The portion of the cycle during which switch 40 remains closed is referred to as the duty cycle D of switch 40, where $0 \geq D \geq 1$. As will be appreciated, voltage across inductor 32 and current through inductor 32 vary over time through each cycle. Therefore, voltages and currents referred to herein are cycle-to-cycle average voltages and currents unless otherwise specified.

In some embodiments, switch 40 may be a transistor controlled by a signal provided to its base, or a MOSFET controlled by a signal to its gate, such as a square-wave voltage pulse. The signal may be a pulse-width modulation signal, such that the pulse width determines the duty cycle of switch 40. The pulse-width signal may be controlled by a microprocessor.

In the absence of losses, DC step up converter 20 operates to step up an input voltage at its input node 42 by a factor proportional to $1/(1-D)$. That is, the voltage at output node 44 is proportional to the voltage at input node 42, multiplied by $1/(1-D)$.

Again, in the absence of losses through DC step up converter 20, the power delivered to the DC step up converter 20, that is, the product of voltage and current at input node 42 is the same as the power output by DC step up converter 20, that is, product of the voltage and current at the output node 44. Thus, the current at output node 44 is stepped down by a factor of $(1-D)$. In other words, the current at node 44 is proportional to the input current at node 42, multiplied by $1-D$, Thus, a higher duty cycle produces a higher output voltage and lower output current. As will be appreciated, for a given output load 18, the duty cycle of switch 40 also determines the current drawn from one of batteries 14, 16.

Of course, DC step up converter 20 will incur losses, so that the product of the output current and voltage is slightly less than that of the input current and voltage.

In normal operation of working circuit 12, switches 22, 24, 26, 28 are open and batteries 14, 16 supply current to output load 18. Diodes 60, 62 maintain the energy levels of batteries 14, 16 in equilibrium. If the voltage produced by one battery is higher than the voltage produced by the other, output load 18 will be driven by the battery with higher voltage. Diodes 60, 62 prevent current from flowing back to the lower-voltage battery. The higher-voltage battery will continue to drive output load 18 until its voltage drops and equalizes with the other battery. Similarly, when DC step up converter 20 is used, its output voltage is elevated from the voltage produced by the battery under test. Diode 60 or 62 prevents current from flowing back to the battery under test. In addition, diodes 60, 62 prevent current flow between batteries 14, 16 in the event that one of batteries 14, 16 becomes defective or is shorted. In some embodiments, diodes 60, 62 may be replaced with an ORing diode, as will be apparent to skilled persons.

Diodes 34, 60, 62 may be diodes with relatively low forward voltage drop and relatively fast switching action, such as Schottky diodes.

When it is desired to test battery 14, switches 22 and 28 may be closed, while switches 24 and 26 may remain open. Current flows from battery 14 by way of closed switch 22 and resistor 50 to the input 42 of DC step up converter 20. Signal outputs 52 and 54 measure the voltage drop across resistor 50, which can be used to determine the amount of current flowing therethrough, based on the Known resistance of resistor 50. As described above, DC step up converter 20 increases or "steps up" the input voltage from battery 14 to a higher voltage at output node 44 of DC step up converter 20. Signal output 58 measures the voltage at output node 44.

Current flows at the stepped up voltage from node 44 by way of switch 28 to battery 16 and through diode 62 to output load 18. Since batteries 14, 16 have the same nominal voltages across their terminals and the voltage output by DC step up converter 20 is higher than the input voltage, a fraction of the current output from DC step up converter 20 is supplied to battery 16 through DC step up converter 20 and charges battery 16. The remaining current is provided to output load 18 and drives working circuit 12.

As explained above, the duty cycle D of switch 40 determines the ratio of the DC step up converter output voltage at output node 44 to its input voltage at input node 42 and the ratio of input to output currents. The input current drawn from battery 14 is determined by the input and output voltages of DC step up converter 20, the output load 18 and the internal resistance of battery 16. The output voltage of DC step up converter 20 is determined by the duty cycle of switch 40, in turn controlled by a micro-controller 70 based on the measured current across resistor 50 and the measured output voltage at 58. For a given input voltage at input node 42 and a given output load 18 and battery internal resistance, increasing the duty cycle of switch 40 will increase the amount of current drawn from battery 14. As will be explained more fully below, the duty cycle may be adjusted until the desired test current is drawn from the battery 14 under test. In some embodiments, the desired test current may be, for example, a fraction of the maximum rated current of the battery under test or the maximum rated current of working circuit 12.

The current drawn from battery 14 may be determined using voltage measurements from signal outputs 52, 54. Using this, the duty cycle of switch 40 may be adjusted until the current drawn from battery 14 is the desired test current. For example, signal outputs 52, 54 could be connected to an operational amplifier 72 which produces an output indicative of voltage drop across resistor 50, which may be connected to a micro-controller 70. Micro-controller 70 may produce a PWM signal to control the duty cycle of switch 40 (not shown) so that the duty cycle is increased until a desired voltage drop is obtained across resistor 50, indicative of a desired test current being drawn from battery 14.

The duty cycle of switch 40 may be limited using the measurements from signal outputs 52, 54, 58 by passing the signals back to micro-controller 70, which adjusts the PWM signal to switch 40 such that the current drawn from battery 14 does not exceed a defined maximum and such that the output voltage at node 44 does not exceed a defined maximum, above which battery 16 would be damaged.

The voltage produced by battery 14 under these conditions can then be directly measured at signal output 52. Signal output 52 may be used as an indicator output to provide a signal indicative of whether battery 14 provides the test current at its rated voltage. For example, signal output 52 may be passed to a comparator (not shown) which compares the voltage at signal output 52 to a reference value and produces a binary output indicative of the condition of battery 14.

Alternatively, the voltage at which battery 14 provides the test current can be or calculated from the duty cycle of switch 40 and the voltage measured at signal output 58 in order to assess the condition of battery 14.

If output load 18 changes during testing, the current drawn from battery 14 will also change. In such an event, the duty cycle of switch 40 may be adjusted in response based on measurements from signal outputs 52, 54, 58. In other words, the duty cycle of switch 40 can be dynamically adjusted so that the current drawn from battery 14 is maintained at a desired test current.

Thus, battery 14 is tested at a desired test current without interrupting the function of output load 18. During testing, DC step up converter 20 provides substantially all the power it receives from battery 14 to battery 16 and output load 18. Some or all of the surplus energy drawn from battery 14 to conduct the test, that is, energy that is not needed for driving working circuit 12, is used to charge battery 16.

When it is desired to test battery 16, switches 24 and 26 are closed and switches 22 and 28 are left open. Current flows from battery 16 by way of resistor 50 to input node 42 of DC step up converter 20, voltage is increased by DC step up converter 20, and current is output at the stepped up voltage and supplied to output load 18 and battery 14. Again, duty cycle of switch 40 may be set such that the desired test current is drawn from battery 16.

Figure 2:
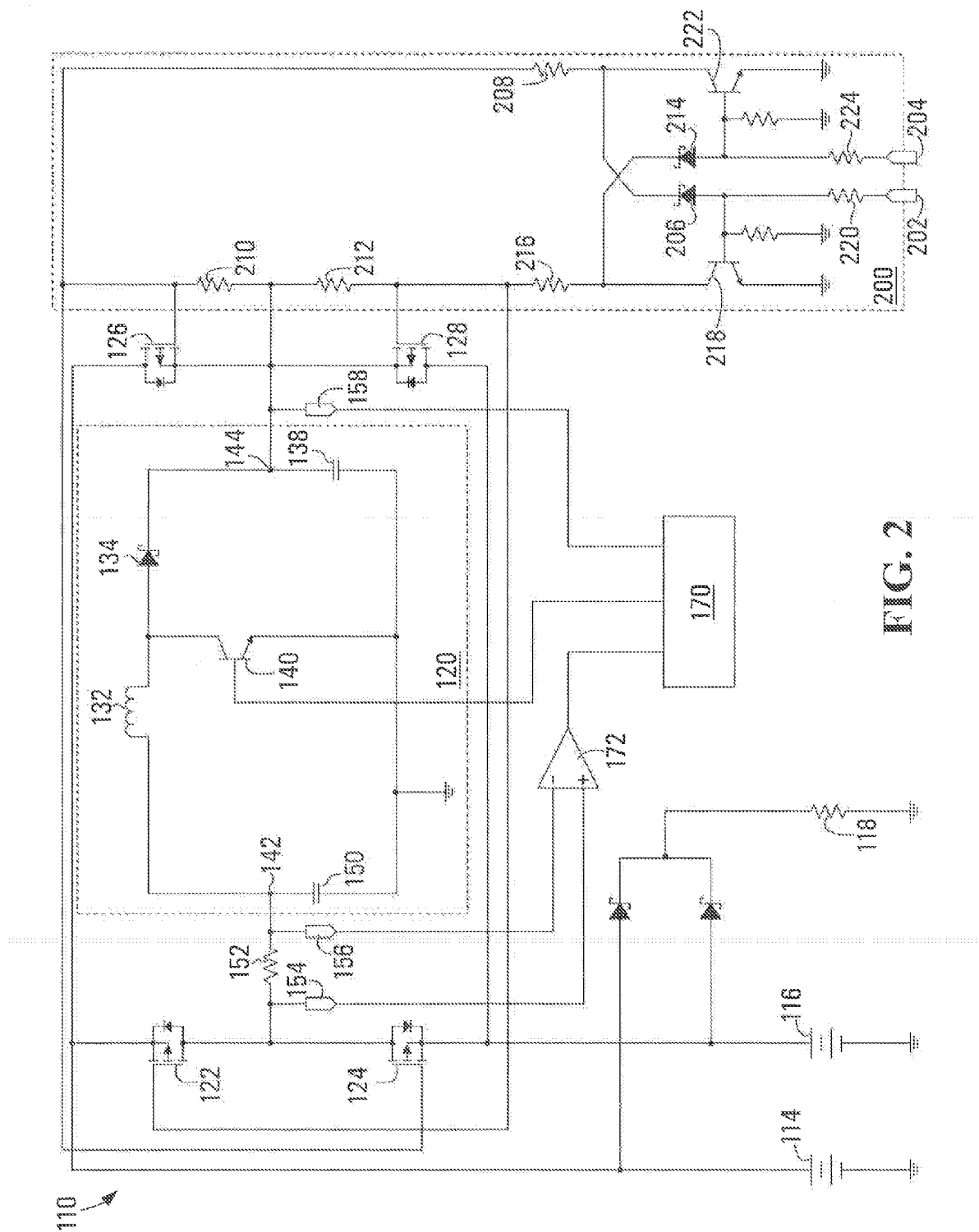
FIG. 2 is a schematic view of an alternate circuit.

In some embodiments, switches 22, 24, 26, 28 may be implemented with MOSFETs. As depicted in FIG. 2, test circuit 110 includes 4 p-type MOS (PMOS) transistors 122, 124, 126 and 128. PMOS transistor 122 connects battery 114 to the input 142 of DC step up converter 120. PMOS transistor 124 connects battery 116 to the Input of DC step up converter 120. PMOS transistor 126 connects battery 114 to the output of DC step up converter 120. PMOS transistor 128 connects battery 116 to the output of DC step up converter 120.

Test circuit 110 includes a DC step up converter 120, which includes inductor 132, diode 134, capacitors 138, 150, and transistor 140. As in DC step up converter 20 the voltage step-up is regulated by the duty cycle of transistor 140. Diode 134 may be a fast switching diode with a low forward voltage drop, such as a Schottky diode. Transistor 140 may be driven by a PWM signal supplied to its base. As will be appreciated, transistor 140 may be replaced with a MOSFET with a PWM signal applied to its gate.

Current drawn from the battery being tested to input node 142 is determined using voltage measurements at signal outputs 154, 156 across the terminals of resistor 152. Voltage at output node 144 is measured at signal output 158. Using these measurements, the duty cycle of transistor 140 can be adjusted such that the desired test current is drawn from the battery being tested and each of the voltage at output node 144 and the current drawn from the battery being tested is limited to a defined maximum.

Test circuit 110 also includes a control circuit 200 with input signals 202, 204 to control the operation of PMOS transistors 122, 124, 126, 128. Control signals 202, 204 have binary values HIGH and LOW, and operate PMOS transistors 122, 124, 126 and 128 in pairs. PMOS transistors 122, 124, 126 and 128 are ON when their respective gates are pulled to ground. This may be accomplished by a suitable controller or processor producing input signals 202, 204.

Input signal 202 is connected to the base of transistor 218 via resistor 220. The collector of transistor 218 is connected to the gates of PMOS transistors 122, 128 via resistor 216. When input signal 202 is HIGH, transistor 218 is turned ON, connecting the gates of PMOS transistors 122, 128 to ground. This turns ON PMOS transistors 122 and 128, connecting battery 114 to the input of DC step up converter 120 and connecting battery 116 to the output of DC step up converter 120. At the same time, the base of transistor 222 is connected to ground through diode 214, which may be a fast switching, low forward voltage drop diode, such as a Schottky diode, and transistor 218. This ensures that the voltage provided to the base of transistor 222 is below the bias voltage of transistor 222. Thus, transistor 222 will never be turned on while signal 202 is HIGH and transistor 218 is turned ON. A voltage HIGH is provided to the gates of transistors 124, 126 from output 144, via resistor 210. This holds transistors 124, 126 in their OFF state.

Input signal 204 is connected to the base of transistor 222 via resistor 224. The collector of transistor 222 is connected to the gates of PMOS transistors 124, 126 via resistor 208. When input signal 204 is HIGH, transistor 222 is turned on, connecting the gates of PMOS transistors 124, 126 to ground. This turns ON PMOS transistors 124 and 126, connecting battery 116 to the input of DC step up converter 120 and connecting battery 114 to the output of DC step up converter 120. At the same time, the base of transistor 218 is connected to ground through diode 206, which may be a fast switching, low forward voltage drop diode, such as a Schottky diode, and transistor 222. This ensures that the voltage provided to the base of transistor 218 is below the bias voltage of transistor 218. Thus, transistor 218 will never be turned on while signal 204 is HIGH and transistor 222 is turned ON. A voltage HIGH is provided to the gates of transistors 122, 128 from output 144, via resistor 212. This holds transistors 122, 128 in their OFF state.

Thus, control signals 202, 204 control the state of test circuit 110. When it is desired to test battery 114 and charge battery 116, control signal 202 goes HIGH and control signal 204 is held LOW. When it is desired to test battery 116 and charge battery 114, control signal 204 goes HIGH and control signal 202 is held LOW. Diodes 206, 214 ensure that the operation of transistors 122, 124, 126, 128 does not overlap, that is, they ensure that no more than one pair of transistors 124, 126 or 122, 128 is turned ON at any time.

Figure 3:
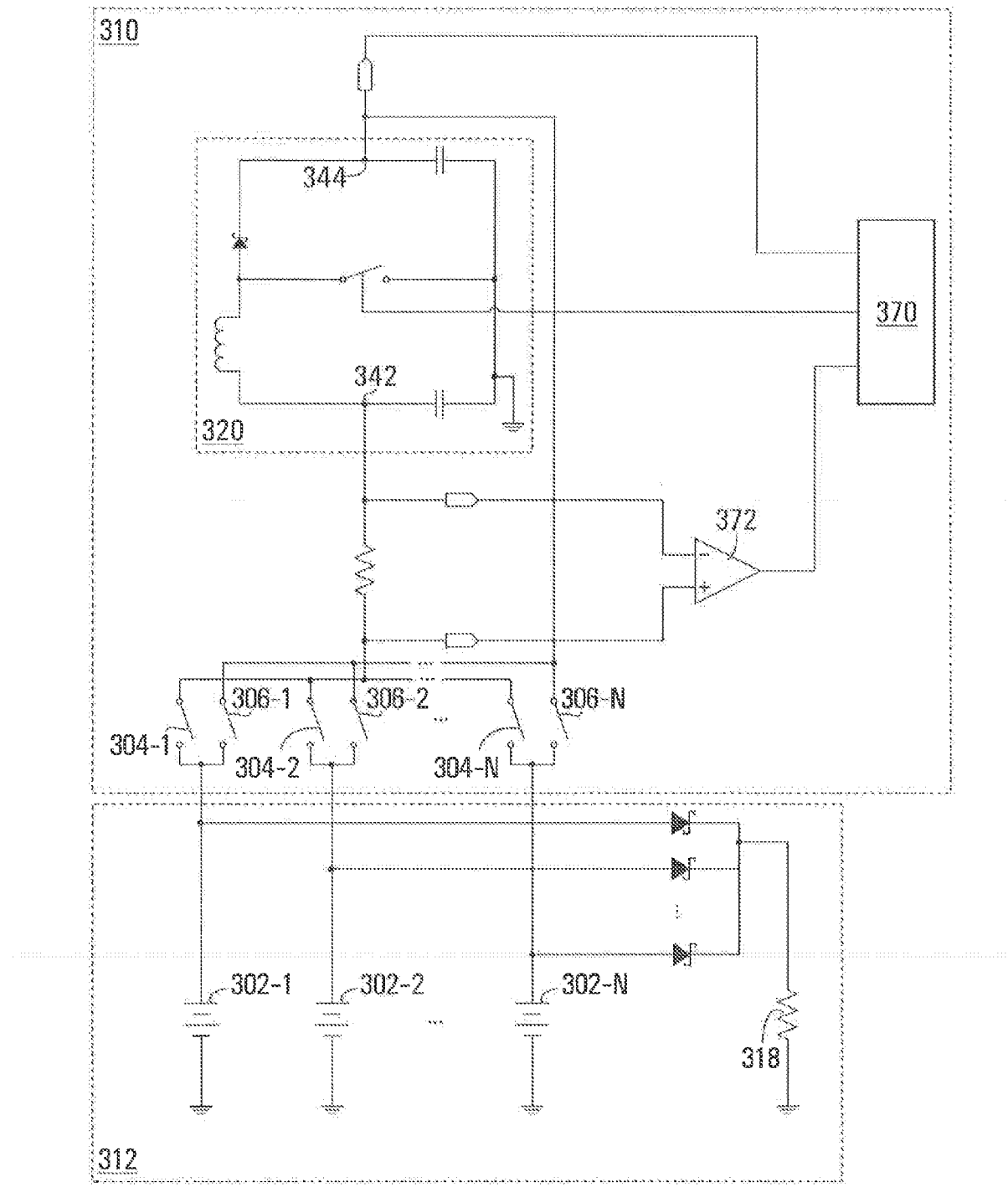
FIG. 3 is a schematic view of a further alternate circuit.

Test circuits 10 and 110 are configured to test batteries in working circuits having two batteries. However, in other embodiments, test circuits may be configured for working circuits with a larger number of batteries. For example, test circuit 310 depicted in FIG. 3, is configured for working circuit 312, which has n batteries 302-1 through 302-N (collectively, batteries 302). Test circuit 310 has a DC step up converter 320 like DC step up converter 20 of test circuit 10. Test circuit 310 has 2n switches, with n switches 304-1 through 304-N (collectively, switches 304) connected to the input 342 of DC step up converter 320 and n switches 306-1 through 306-N (collectively, switches 306) connected to the output 344 of DC step up converter 320. Each battery has one switch 304 for connecting it to the input 342 of DC step up converter 320 and one switch 306 for connecting it to the output of DC step up converter 320. When it is desired to test one of batteries 302, the corresponding one of switches is closed so that current flows from the battery to be tested to DC step up converter 320. During testing, one of switches 306 is also closed so that current can flow from DC step up converter 320 to another one of batteries 302. In order to distribute charging energy, switches 306 may be operated according to an algorithm so that energy is transferred to different ones of batteries 302 in successive tests.

In some embodiments with three or more batteries, an output of a DC step up converter could be interconnected to multiple batteries, while an input of the DC step up converter is connected to a different battery under testing. In such embodiments, test energy drawn from the battery under test is used to transfer energy to multiple batteries simultaneously.

Conveniently, as will now be appreciated, exemplary test circuits 10, 110 and 310 allow batteries to be tested under high/maximum load conditions, without wasting large amounts of energy. Energy delivered as a result of such testing may be recovered by another battery used to power a working circuit. Thus, test circuits 10, 110 and 310 may provide low power dissipation and high efficiency and may eliminate high-power components, relative to a conventional testing system.

Of course, the above described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed:

1. A battery test circuit, for testing batteries in a working circuit having a plurality of batteries and a load, said test circuit comprising:
    a DC step up converter having an input at a first voltage and an output at a second voltage higher than said first voltage, that may be selectively interconnected between a first one of said plurality of batteries and at least one second one of said plurality of batteries to cause said first battery to supply a defined test current and deliver a current from said output to said at least one second one of said plurality of batteries;
    an indicator output, for providing a signal indicative of whether said first battery provides said test current, substantially at the rated voltage of said first battery;
    a plurality of input switches, each one of said input switches for connecting a corresponding one of said plurality of batteries to said input of said DC step up converter; and
    a plurality of output switches, each one of said output switches for connecting a corresponding one of said plurality of batteries to said output of said DC step up converter.

2. The battery test circuit of claim 1, wherein said plurality of input switches comprises three or more switches and said plurality of output switches comprises three or more switches.

3. The battery test circuit of claim 1, wherein said DC step up converter comprises a switch and said test current is adjustable by changing a duty cycle of said switch.

4. The battery test circuit of claim 3, wherein said switch comprises a transistor and said duty cycle is controlled by a pulse-width modulated signal to said transistor.

5. The battery test circuit of claim 1, further comprising a voltage feedback circuit to limit said second voltage supplied to said second battery.

6. The battery test circuit of claim 5, wherein said DC step up converter comprises a switch and said second voltage is limited by limiting a duty cycle of said switch.

7. The battery test circuit of claim 1, further comprising a current feedback circuit to limit said test current.

8. The battery test circuit of claim 7, wherein said DC step up converter comprises a switch and said test current is limited by limiting a duty cycle of said switch.

9. The battery test circuit of claim 1, wherein said DC step up converter may be selectively interconnected between said first one of said plurality of batteries and said at least one second one of said plurality of batteries such that an input power is provided from said first battery to said DC step up converter and said DC step up converter provides total power substantially equal to said input power to said at least one second battery and said load.

10. A method of testing a battery in a working circuit comprising a plurality of batteries, said method comprising:
    interconnecting by way of one of a plurality of input switches, a selected first battery of said plurality of batteries with an input of a DC step up converter to draw a test current at an input voltage from said first battery;
    interconnecting by way of one of a plurality of output switches, a selected second battery of said plurality of batteries with an output of said DC step up converter to supply current at an elevated voltage higher than said input voltage to said second battery and any load interconnected to said second battery;
    monitoring a voltage of said first battery to determine if said first battery is able to provide said test current.

11. The method of claim 10, further comprising adjusting said test current by changing a duty cycle of said DC step up converter.

12. The method of claim 10, further comprising limiting said elevated voltage by limiting a duty cycle of said DC step up converter.

13. The method of claim 10, wherein said interconnecting said first battery comprises closing one of said plurality of input switches to interconnect said DC step up converter to a corresponding one of said plurality of batteries.

14. The method of claim 10, wherein said interconnecting said second battery comprises closing one of said plurality of output switches to interconnect said DC step up converter to a corresponding one of said plurality of batteries.

15. The method of claim 10, further comprising adjusting said elevated voltage to maintain said test current substantially at a maximum rating of said working circuit.

* * * * *

UNITED STATES PATENT AND TRADEMARK OFFICE
CERTIFICATE OF CORRECTION

| | | |
|---|---|---|
| PATENT NO. | : 9,110,107 B2 | Page 1 of 1 |
| APPLICATION NO. | : 13/625999 | |
| DATED | : August 18, 2015 | |
| INVENTOR(S) | : Andrei Bucsa et al. | |

It is certified that error appears in the above-identified patent and that said Letters Patent is hereby corrected as shown below:

On the title page

Item (72) Inventors: "Andrei Busca" should read --Andrei Bucsa--

Signed and Sealed this
Fifteenth Day of March, 2016

Michelle K. Lee
*Director of the United States Patent and Trademark Office*

UNITED STATES PATENT AND TRADEMARK OFFICE
CERTIFICATE OF CORRECTION

PATENT NO. : 9,110,107 B2  
APPLICATION NO. : 13/625999  
DATED : August 18, 2015  
INVENTOR(S) : Andrei Bucsa et al.

Page 1 of 1

It is certified that error appears in the above-identified patent and that said Letters Patent is hereby corrected as shown below:

On the title page

Item (12) should read --Bucsa et al.--

Item (72) Inventors: "Andrei Busca" should read --Andrei Bucsa--

This certificate supersedes the Certificate of Correction issued March 15, 2016.

Signed and Sealed this  
Twenty-eighth Day of June, 2016

Michelle K. Lee  
*Director of the United States Patent and Trademark Office*